United States Patent [19]
Merrill

[11] Patent Number: 5,892,253
[45] Date of Patent: Apr. 6, 1999

[54] ACTIVE PIXEL SENSOR CELL WITH BALANCED BLUE RESPONSE AND REDUCED NOISE

[75] Inventor: Richard Billings Merrill, Woodside, Calif.

[73] Assignee: Foveonics, Inc., Cupertino, Calif.

[21] Appl. No.: 824,451

[22] Filed: Mar. 26, 1997

[51] Int. Cl.$^6$ .................... H01L 31/062; H01L 31/113
[52] U.S. Cl. .................... 257/292; 257/290; 257/291
[58] Field of Search .................... 257/290, 291, 257/292

[56] References Cited

U.S. PATENT DOCUMENTS

| | | | |
|---|---|---|---|
| 5,065,206 | 11/1991 | Nishizawa et al. | 357/30 |
| 5,191,398 | 3/1993 | Mutoh | 257/216 |
| 5,625,210 | 4/1997 | Lu et al. | 257/292 |
| 5,631,704 | 5/1997 | Dickinson et al. | 348/308 |
| 5,698,874 | 12/1997 | Hayashi | 257/233 |
| 5,739,562 | 4/1998 | Ackland et al. | 257/291 |

OTHER PUBLICATIONS

Fossum, E., "Active–pixel sensors challenge CCDs," Technology Guide: Detector Handbook, *Laser Focus World*, Jun. 1993, pp. 83–87, Pasadena, CA.

Mendis, S. et al., "Progress in CMOS Active Pixel Image Sensors," *SPIE* vol. 2172, (1994) Center for Space Microelectronics Tech., Jet Propulsion Laboratory, California Institute of Technology, pp. 19–29, paper presented at a Conference on Feb. 7–8, 1994 in San Jose, CA.

Dickinson, A. et al., "TP 13.5: A 256×256 CMOS Active Pixel Image Sensor with Motion Detection," pp. 226–227, 1995 *IEEE* International Solid–State Circuits Conf., Pasadena, CA., Feb. 16, 1995.

Nixon, R. et al., "256×256 CMOS Active Pixel Sensor Camera–on–a–Chip," ISSCC96/Session/Electronic Imaging Circuits/Paper FA11.1/1996 IEEE International Solid–State Circuits Conference, pp. 178–179.

IEEE/1995/ISSCC Slide Supplement, p. 181.

Sedra, A. et al. "Junction Field–Effect Transistors (JFETs)," Chapter 7, *Microelectronic Circuits*, pp. 251–257, (1982).

Primary Examiner—Ngân V. Ngô
Attorney, Agent, or Firm—Limbach & Limbach L.L.P.

[57] ABSTRACT

In an active pixel sensor cell, the blue response of the cell is balanced by utilizing a photodiode in lieu of a photogate, and the noise is reduced by quickly reading the voltage on a node, transferring the collected charge from the photodiode onto the node, and then again reading the voltage on the node.

11 Claims, 7 Drawing Sheets

ACTIVE PIXEL SENSOR CELL WITH BALANCED BLUE RESPONSE AND REDUCED NOISE

BACKGROUND OF THE INVENTION

1. Field of the Invention.

The present invention relates to active pixel sensor cells and, more particularly, to an active pixel sensor cell with a balanced blue response and reduced noise.

2. Description of the Related Art.

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photogate is typically combined with a number of active transistors which, in addition to forming an electrical signal, provide amplification, readout control, and reset control.

FIG. 1 shows a cross-sectional and schematic view of a conventional CMOS active pixel sensor cell 10. As shown in FIG. 1, cell 10, which is formed in a p-type substrate 12, includes a pair of spaced-apart n+ regions 14 and 16 formed in substrate 12, a polysilicon (poly) photogate 18 formed over and insulated from substrate 12 adjacent to n+ region 14, and a poly transfer gate 20 formed over and insulated from substrate 12 between n+ regions 14 and 16. In addition, photogate 18 is formed to receive a photogate signal PG, while transfer gate 20 is formed to receive a transfer signal TX.

As further shown in FIG. 1, cell 10 also includes a reset transistor 24 having a source connected to n+ region 16 and a gate connected to receive a reset signal RST, a source-follower transistor 26 having a gate connected to n+ region 16, and a row-select transistor 28 having a drain connected to the source of source-follower transistor 26 and a gate connected to receive a row-select signal RS.

The operation of cell 10 begins with an integration period during which light energy in the form of photons penetrates substrate 12 and forms a number of electron-hole pairs. Throughout the integration period, a positive voltage is applied to photogate 18 via photogate signal PG to attract the newly formed electrons to the surface of substrate 12 directly below photogate 18.

Following the integration period, the voltage on n+ region 16 is reset to an initial transfer voltage by pulsing the gate of reset transistor 24 with a positive voltage via reset signal RST. The initial transfer voltage placed on n+ region 16, in turn, defines an initial intermediate voltage on the source of source-follower transistor 26.

Immediately after the gate of reset transistor 24 has been pulsed, the gate of row-select transistor 28 is pulsed with a positive voltage via the row-select signal RS. The positive voltage on the gate of row-select transistor 28 causes the initial intermediate voltage on the source of source-follower transistor 26 to appear on the source of row-select transistor 28 as an initial integration voltage which, in turn, is read out and stored by an imaging system.

Following this, a positive voltage is applied to transfer gate 20 via the transfer signal TX to slightly invert the surface of substrate 12 under transfer gate 20. At the same time, a negative voltage is applied to photogate 18 via the photogate signal PG.

The negative voltage applied to photogate 18 in combination with the positive voltage on n+ region 16 causes the charge collected under photogate 18 to flow through the inverted surface region under transfer gate 20 via n+ region 14 to n+ region 16 where each incoming electron reduces the initial transfer voltage on n+ region 16 to a final transfer voltage.

The final transfer voltage on n+ region 16 is then read out via source-follower transistor 26 as a final integration voltage by again pulsing the gate of row-select transistor 28. As a result, a collected voltage which represents the total charge collected by photogate 18 can be determined by subtracting the final integration voltage from the initial integration voltage.

One of the advantages of cell 10 is that the collected voltage is relatively free from noise. There is essentially no noise associated with photogate 18, and the noise associated with n+ region 16 is minimized by quickly reading the first integration voltage, transferring the charge to n+ region 16, and then reading the second integration voltage.

One problem with cell 10, however, is that photogate 18, which is formed from polysilicon, tends to block 50% or more of the highly energetic blue photons. As a result, the reduced number of blue photons leads to an unbalanced blue response.

One technique for improving the problem of an unbalanced blue response is to utilize a conventional photodiode, which does not require a layer of polysilicon, in lieu of a photogate. FIG. 2 shows a cross-sectional and schematic diagram that illustrates a photodiode-based active pixel sensor cell 50.

As shown in FIG. 2, cell 50, which is formed in p-type substrate 52, includes an n-type region 54 formed in substrate 52, an n+ contact region 56 formed in substrate 52 adjacent to n-type region 54, and a p+ region 58 formed in n-type region 54. Although not required to form a photodiode, p+ region 58 is commonly used to passivate the Si/SiO$_2$ interface.

As further shown in FIG. 2, cell 50 also includes a reset transistor 60 having a source connected to n+ region 56 and a gate connected to receive a reset signal RST, a source-follower transistor 62 having a gate connected to n+ region 56, and a row-select transistor 64 having a drain connected to the source of source-follower transistor 62 and a gate connected to receive a row-select signal RS.

Operation of active pixel sensor cell 50 is performed in three steps: a reset step, where cell 50 is reset from the previous integration cycle; an image integration step, where the light energy is collected and converted into an electrical signal; and a signal readout step, where the signal is read out.

During the reset step, the potential on n-type region 54 and n+ contact region 56 is raised to an initial transfer voltage by pulsing the gate of reset transistor 60 with a positive voltage via the reset signal. As above, the initial transfer voltage placed on n+ region 56 also defines an initial intermediate voltage on the source of source-follower transistor 62.

Immediately after the gate of reset transistor 60 has been pulsed, the gate of row-select transistor 64 is pulsed with a positive voltage via the row-select signal RS. The positive voltage on the gate of row-select transistor 64 causes the initial intermediate voltage on the source of source-follower transistor 62 to appear on the source of row-select transistor 64 as an initial integration voltage which, in turn, is read out and stored by an imaging system.

Following this, the integration step begins. During integration, light energy, in the form of photons, penetrates into p+ region 58, n-type region 54, and substrate 52, thereby creating a number of electron-hole pairs.

The photogenerated electrons formed in p+ region 58 and substrate 52 which diffuse into the junction regions are attracted to n-type region 54 and n+ contact region 56 under the influence of the junction electric fields, while the photogenerated electrons formed in n-type region 54 remain in n-type region 54 where each additional electron reduces the potential on n-type region 54 and n+ contact region 56.

Thus, at the end of the integration step, the potential on n-type region 54 and n+ contact region 56 will have been reduced to a final transfer voltage where the amount of the reduction represents the intensity of the received light energy.

Following the image integration period, the final transfer voltage on n+ region 56 is then read out via source-follower transistor 62 as a final integration voltage by again pulsing the gate of row-select transistor 64. As a result, a collected voltage which represents the total charge collected by cell 50 can be determined by subtracting the final integration voltage from the initial integration voltage.

One of the problems with active pixel sensor cell 50, however, is that the period conventionally used to integrate the image, i.e., the time between reading out the initial and final integration voltages, which is approximately 30 mS, introduces noise into the collected voltage.

Thus, there is a need for an active pixel sensor cell that provides a balanced blue response and at the same time minimizes the introduction of noise into the collection voltage.

SUMMARY OF THE INVENTION

Conventional photogate-based active pixel sensor cells suffer from an unbalanced blue response as a result of the polysilicon in the photogate partially blocking the blue photons. On the other hand, conventional photodiode-based active pixel sensor cells suffer from noise due to the length of the integration period.

The present invention provides a balanced blue response by utilizing a photodiode in lieu of a photogate, and reduced noise by reading the voltage on a node, quickly transferring the collected charge from the photodiode onto the node, and then again reading the voltage on the node.

An active pixel sensor cell in accordance with the present invention, which is formed in a semiconductor substrate of a first conductivity type, includes a first region of a second conductivity type formed in the substrate, a second region of the first conductivity type formed in the first region, and a third region of the second conductivity type formed in the substrate.

In addition, a channel region is defined between the first region and the third region, and an electrode is formed over and insulated from the channel region and a portion of the first region. The electrode is formed to receive a bias signal, while the second region is formed to receive a clock signal.

The cell of the present invention further includes a reset transistor having a source connected to the third region and a gate connected to receive a reset signal, a source-follower transistor having a gate connected to the third region, and a row-select transistor having a drain connected to the source of source-follower transistor and a gate connected to receive a row-select signal.

The present invention also includes a method for operating the active pixel sensor cell which includes the steps of removing majority carriers from the first region to form a depleted region, collecting majority carriers in the depleted region in response to received light energy, and resetting the voltage on the third region to an initial transfer voltage.

The method further includes the steps of reading the initial transfer voltage, transferring the majority carriers collected in the depleted region to the third region where the majority carriers change the initial transfer voltage to a final transfer voltage, and reading the final transfer voltage.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 5A is a plan view illustrating the substrate layout level, FIG. 5B is a plan view illustrating the polysilicon layout level, and FIG. 5C is a plan view illustrating the metal layout level.

DETAILED DESCRIPTION

Figure 1:
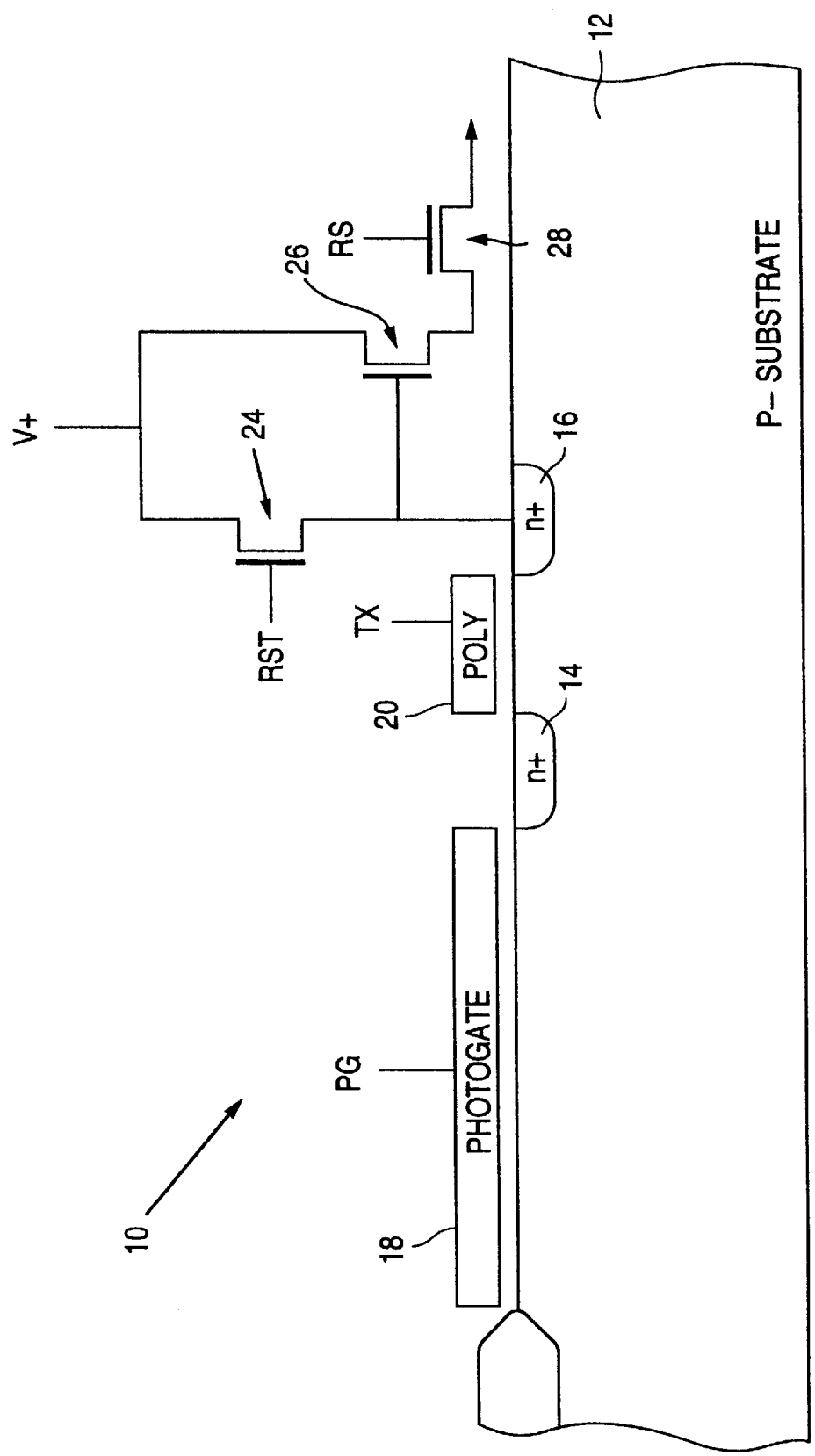
FIG. 1 is a cross-sectional and schematic diagram illustrating a conventional CMOS active pixel sensor cell 10.
Figure 2:
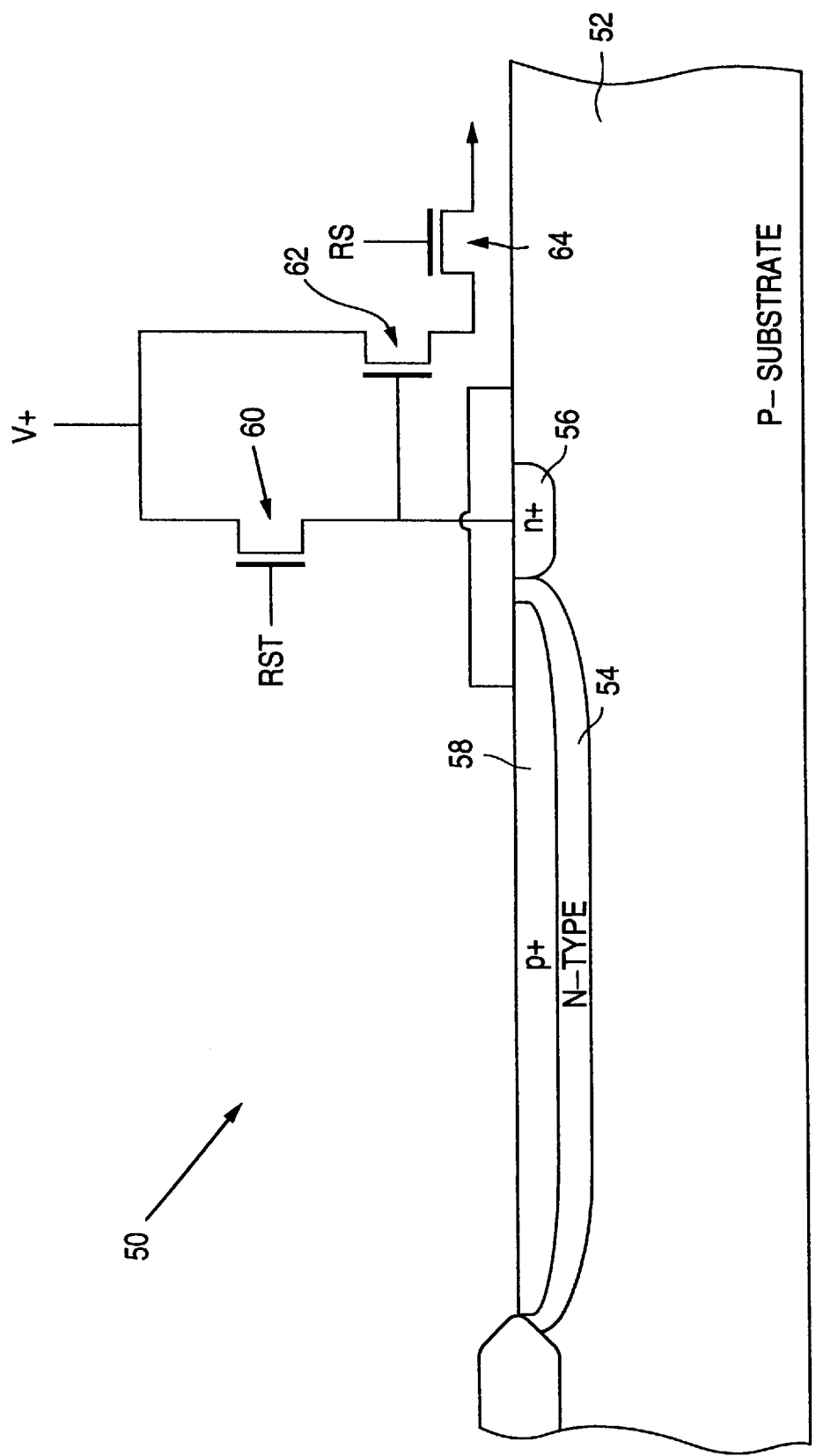
FIG. 2 is a cross-sectional and schematic diagram illustrating a conventional photodiode-based active pixel sensor cell 50.
Figure 3:
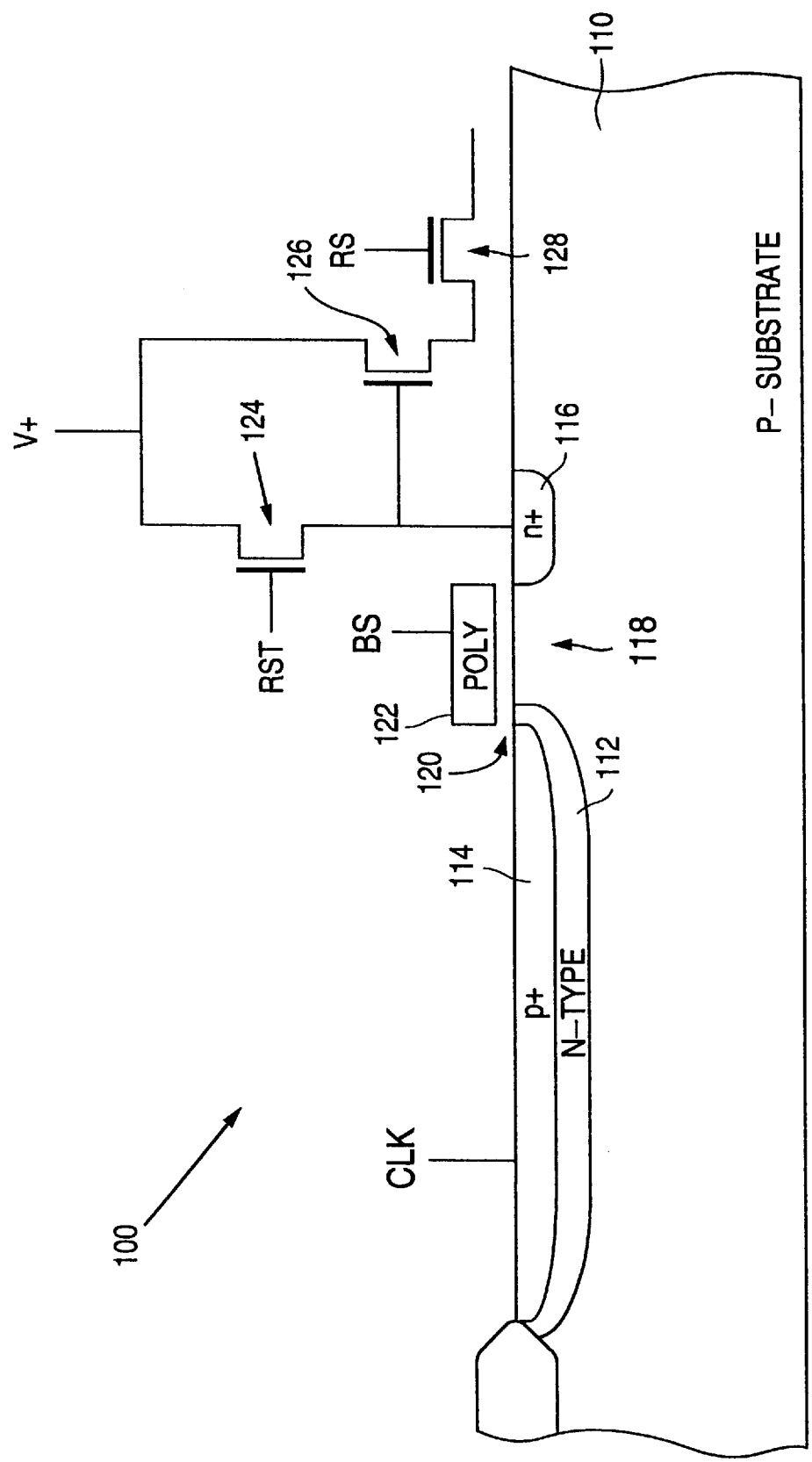
FIG. 3 is a cross-sectional and schematic diagram illustrating a photodiode-based active pixel sensor cell 100 in accordance with the present invention.

FIG. 3 shows a cross-sectional and schematic diagram of a photodiode-based active pixel sensor cell 100 in accordance with the present invention. As described in greater detail below, cell 100 provides a balanced blue response by utilizing a photodiode in lieu of a photogate, and reduced noise by quickly reading the voltage on a node, transferring the collected charge from the photodiode onto the node, and then again reading the voltage on the node.

As shown in FIG. 3, cell 100, which is formed in a p-type substrate 110, includes an n-type region 112 formed in substrate 110, a p+ region 114 formed in n-type region 112 to receive a clock signal CLK, and an n+ region 116 formed in p-type substrate 110. In addition, cell 100 also includes a channel region 118 defined between n-type region 112 and n+ region 116.

As further shown in FIG. 3, a layer of insulation material 120 is formed over substrate 110, and a polysilicon (poly) electrode 122 is formed on the layer of insulation material over channel region 118 and a portion of n-type region 112 to receive a DC bias BS.

Cell 100 additionally includes a reset transistor 124 having a source connected to n+ region 116 and a gate connected to receive a reset signal RST, a source-follower transistor 126 having a gate connected to n+ region 116, and a row-select transistor 128 having a drain connected to the source of source-follower transistor 126 and a gate connected to receive a row-select signal RS.

Operation of active pixel sensor cell 100 is performed in four steps: a reset step, where all of the majority carriers are removed from n-type region 112; an image integration step, where the light energy is collected and converted into an electrical charge; a first readout step, where a baseline charge is read out; and a second readout step, where the charge representing the light energy is read out. The difference between the baseline charge and the charge representing the light energy constitutes the integration signal.

Figure 4A:
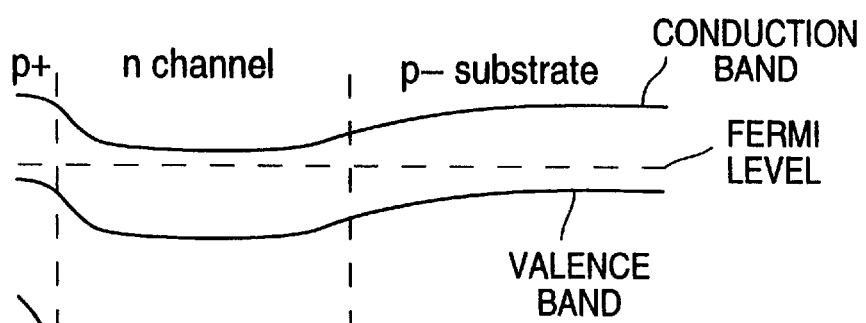
FIG. 4A is a band diagram illustrating p+ region 114, n-type region 112, and substrate 110 in the equilibrium condition.

Prior to the reset step, both the p+/n-type and n-type/substrate junctions are in equilibrium. FIG. 4A shows a band diagram that illustrates p+ region 114, n-type region 112, and substrate 110 in the equilibrium condition.

During the reset step, all of the majority carriers are removed from n-type region 112 by pulsing p+ region 114 with a negative voltage via clock signal CLK to reverse bias the p+/n-type junction. The magnitude of the negative voltage applied to p+ region 114 is selected so as to cause the junction depletion region at the p+/n-type junction to extend over and join the junction depletion region at the n-type/substrate junction.

At the same time, a positive voltage, such as one volt, is applied to poly electrode 122 via the DC bias BS to slightly invert the surface of channel region 118. In the preferred embodiment, the DC bias BS is continuously applied to poly electrode 122 to isolate n+ region 116 from any noise associated with the clock signal CLK.

Figure 4B:
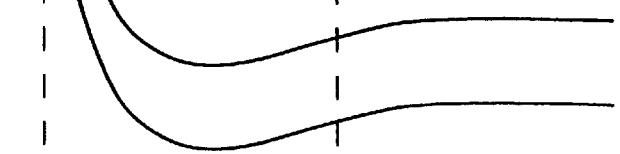
FIG. 4B is a band diagram illustrating p+ region 114, n-type region 112, and substrate 110 after p+ region 114 is negatively biased and n-type region 112 is depleted of electrons.

Thus, as a result of extending the p+/n-type junction depletion region over to the n-type/substrate junction depletion region via the negative voltage applied to p+ region 114, and applying a positive voltage to electrode 122, all of the majority carriers in n-type region 112 flow from n-type region 112 through channel region 118 to n+ region 116 (which is more positive than the voltage applied to p+ region 112), thereby depleting n-type region 112 of majority carriers. FIG. 4B shows a band diagram that illustrates p+ region 114, n-type region 112, and substrate 110 after p+ region 114 is negatively biased and n-type region 112 is depleted of electrons.

Figure 4C:
FIG. 4C is a band diagram illustrating p+ region 114, n-type region 112, and substrate 110 following the trailing edge of the negative voltage pulse applied to p+ region 114.

The reset step is completed following the trailing edge of the negative voltage pulse applied to p+ region 114. FIG. 4C shows a band diagram that illustrates p+ region 114, n-type region 112, and substrate 110 following the trailing edge of the negative voltage pulse. Thus, as shown in FIG. 4C, the depleted n-type region 112 has a positive charge which strongly reverse biases both the p+/n-type junction and the n-type/substrate junction.

During the integration step, cell 100 begins collecting light energy in the form of photons. The photons penetrate into p+ region 114, n-type region 112, and substrate 110, thereby creating a number of electron-hole pairs. Cell 100 is designed to limit recombination between the newly formed electron-hole pairs.

The photogenerated electrons formed in p+ region 114 and substrate 110 which drift into the depletion regions at the p+/n-type and n-type/substrate junctions, respectively, are attracted to n-type region 112 under the influence of the junction electric fields, while the photogenerated electrons formed in n-type region 112 remain in n-type region 112.

Similarly, the photogenerated holes formed in n-type region 112 which drift into the depletion regions at the p+/n-type and n-type/substrate junctions are attracted to p+ region 114 and substrate 110, respectively, under the influence of the junction electric fields, while the photogenerated holes formed in p+ region 114 and substrate 110 remain in those regions.

Figure 4D:
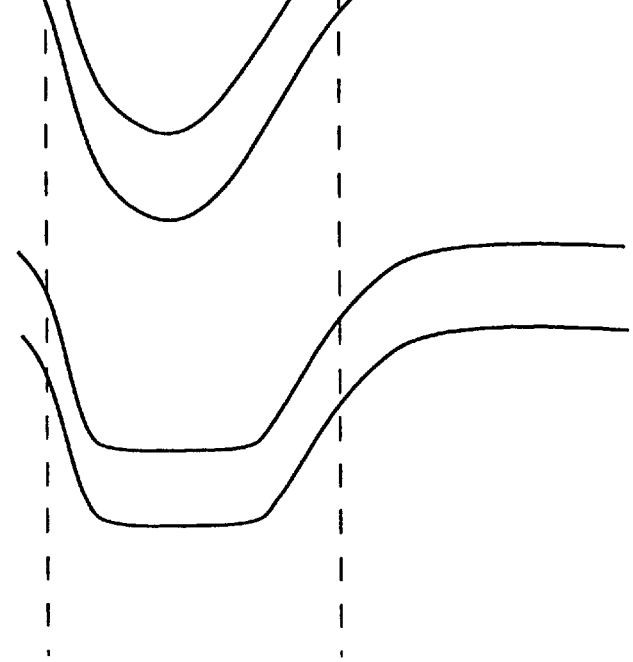
FIG. 4D is a band diagram illustrating p+ region 114, n-type region 112, and substrate 110 at the end of an integration cycle.

Thus, at the end of the integration period, n-type region 112 will have collected some number of electrons which have a total charge that represents the intensity of the received light energy. FIG. 4D shows a band diagram that illustrates p+ region 114, n-type region 112, and substrate 110 at the end of an integration cycle.

During the first readout step, which begins after the integration step has been completed, the voltage on n+ region 116 is reset to an initial transfer voltage by pulsing the gate of reset transistor 124 with a positive voltage via reset signal RST. The initial transfer voltage placed on n+ region 116 also defines an initial intermediate voltage on the source of source-follower transistor 126.

Immediately after the gate of reset transistor 124 has been pulsed, the gate of row-select transistor 128 is pulsed with a positive voltage via the row-select signal RS. The positive voltage on the gate of row-select transistor 128 causes the initial intermediate voltage on the source of source-follower transistor 126 to appear on the source of row-select transistor 128 as an initial integration voltage which, in turn, is read out and stored by an imaging system.

During the second readout step, which begins after the initial integration voltage has been read, all of the majority carriers from n-type region 112 are then transferred to n+ region 116 via channel region 118 by again applying the negative voltage to p+ region 114 via the clock signal CLK immediately after the gate of row-select transistor 128 has been pulsed.

The negative voltage applied to p+ region 114 in combination with the positive voltage on n+ region 116 causes the charge collected in n-type region 112 to flow through the inverted surface region under poly electrode 122 to n+ region 116 where each electron reduces the initial transfer voltage on n+ region 116 to a final transfer voltage. As with the intermediate transfer voltage, the final transfer voltage defines a final intermediate voltage on the source of source-follower transistor 126.

After the negative voltage is applied to p+ region 114, the gate of row-select transistor is again pulsed via the row-select signal RS which, in turn, causes the final intermediate voltage on the source of source-follower transistor 126 to appear on the source of row select transistor 128 as a final integration voltage. The total number of collected electrons is then determined by subtracting the final integration voltage from the initial integration voltage.

Thus, an active pixel sensor cell has been described that provides a balanced blue response by utilizing a photodiode in lieu of a photogate, and at the same time minimizes the introduction of noise by reading out the charge that represents the collected light energy immediately after reading out a baseline charge.

In addition to providing a balanced blue response and reduced noise, the present invention also provides automatic antiblooming in that whenever the potential on n+ region 112 is approximately 0.6 volts less than the potential on substrate 112, the junction between the two regions becomes forward-biased.

Figure 5A:
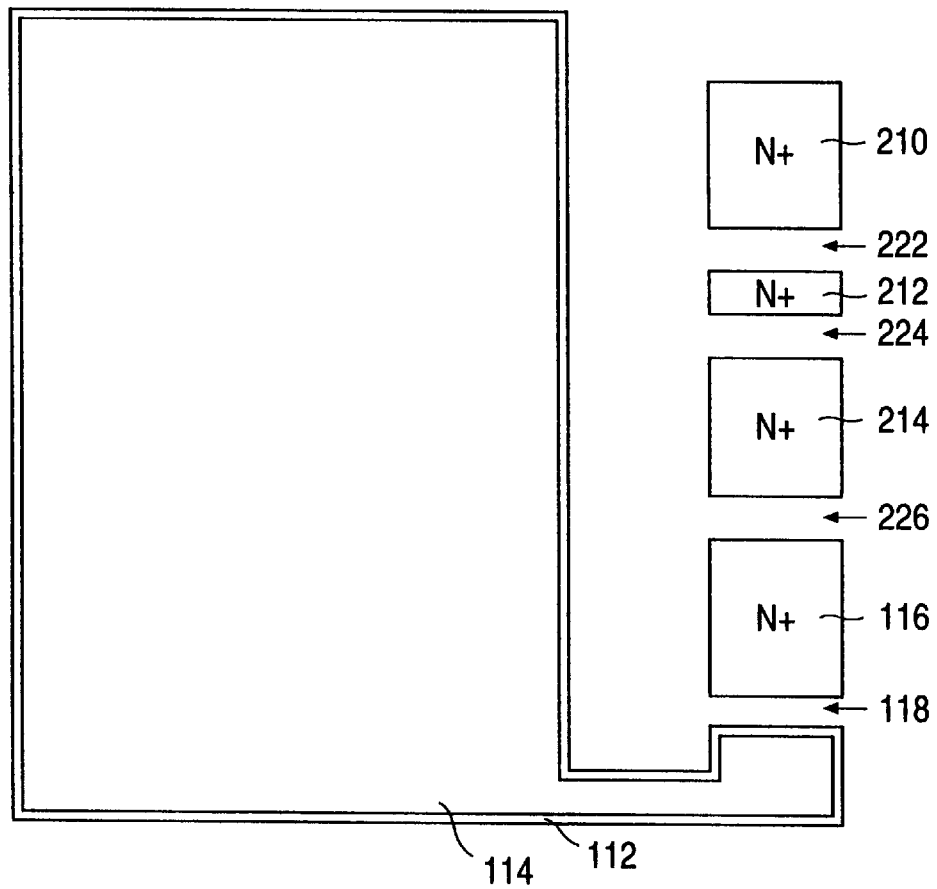
FIGS. 5A–5C are a series of plan views illustrating the layout of cell 100.
Figure 5B:
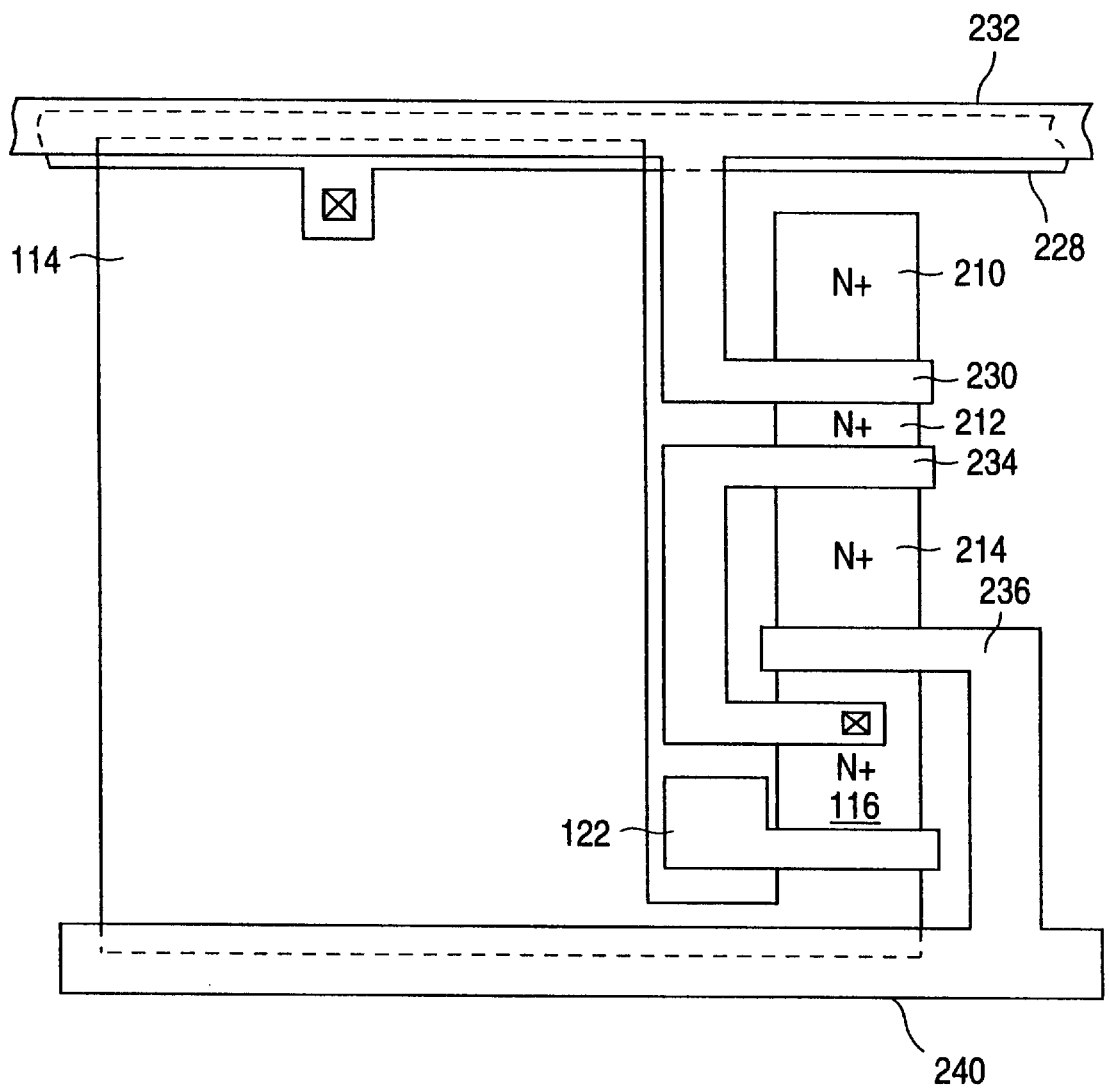
Figure 5C:
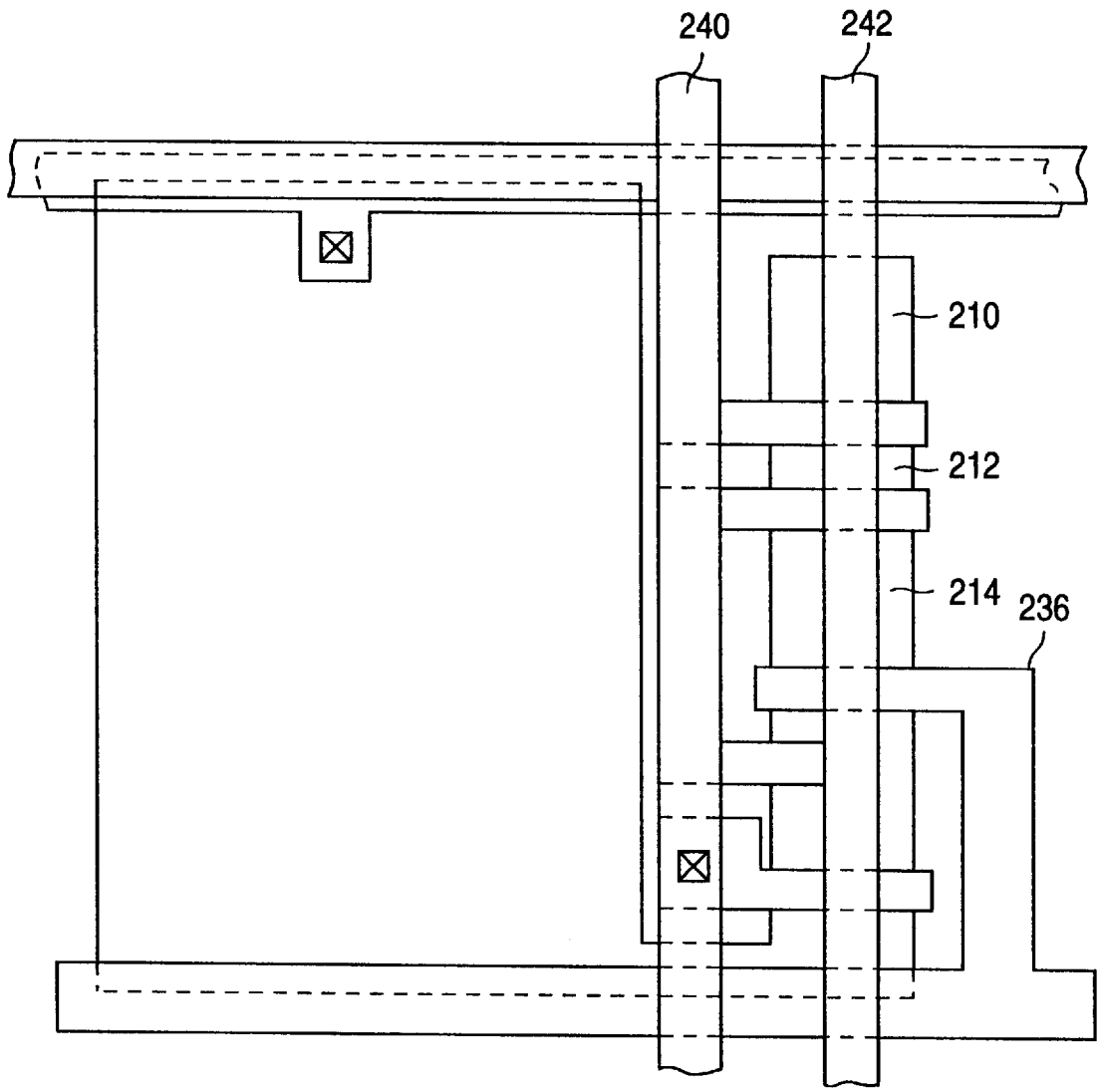

FIGS. 5A–5C show a series of plan views that illustrate the layout of cell 100. FIG. 5A shows a plan view that illustrates the substrate layout level, FIG. 5B shows a plan view that illustrates the poly layout level, and FIG. 5C shows a plan view that illustrates the metal layout level.

As shown in the substrate layout level of FIG. 5A, a plurality of n+ regions are formed in the substrate. The n+ regions include n-type region 112, n+ region 116, an n+ region 210 that forms the source of row-select transistor 128, an n+ region 212 that forms both the drain of row-select transistor 128 and the source of source-follower transistor 126, and an n+ region 214 that forms both the drain of source-follower transistor 126 and the drain of reset transistor 124. In addition, p+ region 114 is formed in n+ region 112.

As further shown in FIG. 5A, a plurality of channel regions are defined in the substrate. The channel regions include channel region 118, a p-type channel region 222 formed between n+ region 210 and n+ region 212, a p-type channel region 224 formed between n+ region 212 and n+ region 214, and a p-type channel region 226 formed between n+ region 214 and n+ region 116.

As shown in the poly layout level of FIG. 5B, a plurality of poly lines are formed over the substrate. The poly lines include poly electrode 122, a poly clock line 228 (and an underlying layer of insulation) connected to p+ layer 114, a row-select poly line 230 (and an underlying layer of insulation) formed over a first side of n+ region 112 and channel region 222, a source-follower poly line 234 (and an underlying layer of insulation) formed over channel region 224 and connected to n+ region 116, and a reset poly line 240 (and an underlying layer of insulation) formed over a second side of n+ region 112 and channel region 226.

As shown in the metal layout level of FIG. 5C, a plurality of metal lines are formed over the poly lines. The metal lines include a first metal line 240 (and an underlying layer of insulation) that is formed to contact poly electrode 122, and a second metal line 242 that is formed to contact n+ region 214.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for operating an active pixel sensor cell formed in a semiconductor substrate of a first conductivity type, the cell comprising:

a first region of a second conductivity type formed in the substrate;

a second region of the first conductivity type formed in the first region;

a third region of the second conductivity type formed in the substrate;

a channel region defined between the first region and the third region;

an electrode formed over and insulated from the channel region and a portion of the first region, the electrode formed to receive a bias signal;

a reset transistor having a source connected to the third region and a gate connected to receive a reset signal;

a source-follower transistor having a gate connected to the third region; and a row-select transistor having a drain connected to the source of source-follower transistor and a gate connected to receive a row-select signal, the method comprising the steps of:

removing majority carriers from the first region to form a depleted region;

collecting majority carriers in the depleted region in response to received light energy;

resetting the voltage on the third region to an initial transfer voltage;

reading the initial transfer voltage;

transferring the majority carriers collected in the depleted region to the third region, the majority carriers changing the initial transfer voltage to a final transfer voltage; and reading the final transfer voltage.

2. The method of claim 1 wherein the majority carriers are removed from the first region by pulsing the second region with a first voltage.

3. The method of claim 2 wherein the first voltage is a negative voltage.

4. The method of claim 2 wherein the first voltage causes a first depletion region in the first region at the first region to second region junction to extend over and join a second depletion region in the first region at the first region to substrate junction.

5. The method of claim 1 wherein the voltage on the third region is reset to the initial transfer voltage by pulsing the gate of the reset transistor with a voltage sufficient to turn on the reset transistor.

6. The method of claim 1 wherein the initial transfer voltage is read by pulsing the gate of the row select transistor with a voltage sufficient to turn on the row-select transistor.

7. The method of claim 1 wherein the final transfer voltage is read by pulsing the gate of the row select transistor with a voltage sufficient to turn on the row-select transistor.

8. The method of claim 1 wherein the majority carriers collected in the depleted region are transferred to the third region by applying the negative voltage to the second region, and applying a third voltage to the electrode.

9. An active pixel sensor cell formed on a silicon substrate, the cell comprising:

a plurality of heavily-doped regions formed in the substrate that includes first, second, third, fourth, and fifth heavily-doped regions;

a plurality of channel regions defined in the substrate that includes first, second, third, and fourth channel regions, the first channel region being defined between the first and second heavily-doped regions, the second channel region being defined between the second and third heavily-doped regions, the third channel region being defined between the third and fourth heavily-doped regions, and the fourth channel region being defined between the fourth and fifth heavily-doped regions;

a plurality of polysilicon (poly) lines that include a first poly line formed over and insulated from a first side of the first heavily-doped region and the fourth channel region, and a second poly line formed over and insulated from a second side of the first heavily-doped region and the second channel region.

10. The cell of claim 9 and further comprising a third poly line formed over and insulated from the third channel region and contacting the second heavily-doped region.

11. The cell of claim 9 and further comprising a third poly line formed over and insulated from the first heavily-doped region that contacts the first heavily-doped region.

* * * * *